United States Patent
Jung et al.

(10) Patent No.: US 11,335,867 B2
(45) Date of Patent: May 17, 2022

(54) DISPLAY PANEL INCLUDING A GROOVE BETWEEN AN OPENING AND A DISPLAY AREA

(71) Applicant: Samsung Display Co., Ltd., Yongin-si (KR)

(72) Inventors: Younjae Jung, Yongin-si (KR); Jongwoo Park, Yongin-si (KR); Taeyoung Kim, Yongin-si (KR); Hyojung Kim, Yongin-si (KR); Kiju Im, Yongin-si (KR); Hyuncheol Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 83 days.

(21) Appl. No.: 16/718,956

(22) Filed: Dec. 18, 2019

(65) Prior Publication Data
US 2020/0313101 A1    Oct. 1, 2020

(30) Foreign Application Priority Data

Mar. 27, 2019    (KR) .................. 10-2019-0035116

(51) Int. Cl.
*H01L 51/00* (2006.01)
*H01L 27/32* (2006.01)
*H01L 51/52* (2006.01)

(52) U.S. Cl.
CPC ...... *H01L 51/0096* (2013.01); *H01L 27/3244* (2013.01); *H01L 51/5253* (2013.01)

(58) Field of Classification Search
CPC combination set(s) only.
See application file for complete search history.

(56) References Cited

U.S. PATENT DOCUMENTS

| | | | |
|---|---|---|---|
| 5,837,427 A | 11/1998 | Hwang et al. | |
| 9,905,629 B2 | 2/2018 | Kim et al. | |
| 2018/0047802 A1* | 2/2018 | Yoon | H01L 27/3262 |
| 2018/0069063 A1 | 3/2018 | Kim et al. | |
| 2018/0183015 A1 | 6/2018 | Yun et al. | |
| 2018/0186690 A1 | 7/2018 | Park et al. | |
| 2020/0119304 A1* | 4/2020 | Choi | H01L 51/52 |
| 2020/0168683 A1* | 5/2020 | Son | H01L 27/3258 |
| 2020/0194714 A1* | 6/2020 | Won | H01L 51/5246 |

FOREIGN PATENT DOCUMENTS

| | | | |
|---|---|---|---|
| KR | 10-2017-0115177 A | 10/2017 | |
| KR | 10-2018-0026599 A | 3/2018 | |
| KR | 10-2018-0076429 A | 7/2018 | |

\* cited by examiner

*Primary Examiner* — Nduka E Ojeh
(74) *Attorney, Agent, or Firm* — Lewis Roca Rothgerber Christie LLP

(57) ABSTRACT

A display panel includes: a plurality of display elements arranged in a display area around an opening, each of the display elements including a pixel electrode, an emission layer above the pixel electrode, and an opposite electrode above the emission layer; and a groove between the opening and the display area, wherein the groove includes a first recessed portion having a first width in a first layer, and a second recessed portion in a second layer on the first layer and having a second width greater than the first width, and a side surface of the groove includes steps.

20 Claims, 17 Drawing Sheets

DISPLAY PANEL INCLUDING A GROOVE BETWEEN AN OPENING AND A DISPLAY AREA

CROSS-REFERENCE TO RELATED APPLICATION

This application claims priority to and the benefit of Korean Patent Application No. 10-2019-0035116, filed on Mar. 27, 2019 in the Korean Intellectual Property Office, the entire disclosure of which is incorporated herein by reference.

BACKGROUND

1. Field

Aspects of embodiments relate to a display panel, and a display device including the display panel.

2. Description of the Related Art

The usage of display devices is diversifying. In addition, the thickness and the weight of the display devices are decreasing, and the range of use thereof is widening.

Various functions for connecting or linking to display devices have been added, while the area occupied by a display area in such display devices has increased. As a method of adding various functions while enlarging the area, research into a display device having an opening in a display area has been continuing. However, in the case of a display device having an opening, foreign matter, such as moisture, may penetrate a side surface of the opening, and display elements surrounding the opening may be damaged at this time.

SUMMARY

According to aspects of one or more embodiments, a display panel has a structure capable of preventing or substantially preventing moisture permeation through an opening, and a display device including the display panel is provided. According to aspects of one or more embodiments, a display panel includes a groove around an opening, and a display device including the display panel is provided. However, these are merely examples, and the scope of the present disclosure is not limited thereto.

Additional aspects will be set forth, in part, in the description which follows and, in part, will be apparent from the description, or may be learned by practice of the presented embodiments.

According to one or more embodiments, a display panel includes: a plurality of display elements arranged in a display area around an opening, each of the display elements including a pixel electrode, an emission layer above the pixel electrode, and an opposite electrode above the emission layer; and a groove between the opening and the display area, wherein the groove includes a first recessed portion having a first width in a first layer, and a second recessed portion in a second layer on the first layer and having a second width greater than the first width, and a side surface of the groove includes steps.

In an embodiment, the display panel may further include at least one of a first functional layer between the pixel electrode and the emission layer, and a second functional layer between the emission layer and the opposite electrode, wherein at least one of the first functional layer and the second functional layer and the opposite electrode may each be cut off around the second recessed portion and located on a side wall of the first recessed portion.

In an embodiment, the display panel may further include a capping layer above the opposite electrode, wherein the capping layer may be continuously arranged over the first recessed portion and the second recessed portion.

In an embodiment, the first layer may include a first organic material layer and a first inorganic material layer on the first organic material layer, and the first recessed portion may spatially connect a hole passing through the first inorganic material layer to a recess defined in a depth direction of the first organic material layer.

In an embodiment, the first layer may include a first organic material layer and a first inorganic material layer on the first organic material layer, and the first recessed portion may spatially connect a hole passing through the first inorganic material layer to an upper surface of the first organic material layer.

In an embodiment, the display panel may further include at least one of a first functional layer between the pixel electrode and the emission layer, and a second functional layer between the emission layer and the opposite electrode, wherein at least one of the first functional layer and the second functional layer and the opposite electrode may each be cut off around the second recessed portion and located on an upper surface of the first layer exposed by the second recessed portion.

In an embodiment, the display panel may further include a substrate and a pixel circuit arranged on the substrate and including a thin-film transistor above the substrate and electrically connected to the pixel electrode.

In an embodiment, the substrate may include a portion of the first layer.

In an embodiment, the second layer may include a multi-layered inorganic layer.

In an embodiment, the groove may include a first groove and a second groove around the first groove, and the display panel may further include a dam portion protruding between the first groove and the second groove in a direction of an upper surface of a substrate.

In an embodiment, the display panel may further include a thin-film encapsulation layer covering the plurality of display elements and including a first inorganic encapsulation layer, an organic encapsulation layer, and a second inorganic encapsulation layer which are sequentially laminated, wherein the organic encapsulation layer may be above the first groove and the first inorganic encapsulation layer, and the first inorganic encapsulation layer and the second inorganic encapsulation layer may directly contact the second groove.

In an embodiment, the display panel may further include a thin-film encapsulation layer covering the plurality of display elements and including a first inorganic encapsulation layer, an organic encapsulation layer, and a second inorganic encapsulation layer which are sequentially laminated, and a planarization layer above the thin-film encapsulation layer, wherein an end of the planarization layer may be on a vertical line passing through the groove.

According to one or more embodiments, a display panel includes: a substrate comprising an opening and a display area around the opening; a plurality of display elements located in the display area and each comprising a pixel electrode, an intermediate layer, an emission layer, and an opposite electrode; and a groove between the opening and the display area, wherein the groove includes a first recessed portion having a first width in a first layer, and a second recessed portion in a second layer on the first layer and having a second width greater than the first width, a side surface of the groove includes steps, and the intermediate layer is cut off from the groove and located on a side wall of the first recessed portion or a side wall of the second recessed portion.

In an embodiment, the display panel may further include a capping layer on the opposite electrode, wherein the capping layer may be continuously arranged over the first recessed portion and the second recessed portion.

In an embodiment, the first layer may include a first organic material layer and a first inorganic material layer on the first organic material layer, and the first recessed portion may spatially connect a hole passing through the first inorganic material layer to a recess defined in a depth direction of the first organic material layer.

In an embodiment, the first layer may include a first organic material layer and a first inorganic material layer on the first organic material layer, and the first recessed portion may spatially connect a hole passing through the first inorganic material layer to an upper surface of the first organic material layer.

In an embodiment, the display panel may further include a pixel circuit including a thin-film transistor above the substrate and electrically connected to the pixel electrode.

In an embodiment, the substrate may include a portion of the first layer.

In an embodiment, the groove may include a first groove and a second groove around the first groove, and the display panel may further include a dam portion protruding between the first groove and the second groove in a direction of an upper surface of a substrate.

In an embodiment, the display panel may further include a thin-film encapsulation layer covering the plurality of display elements and including a first inorganic encapsulation layer, an organic encapsulation layer, and a second inorganic encapsulation layer which are sequentially laminated, and a planarization layer above the thin-film encapsulation layer, wherein an end of the planarization layer may be on a vertical line passing through the groove.

Additional aspects will be set forth, in part, in the description which follows and, in part, will be apparent from the description, or may be learned by practice of the presented embodiments.

BRIEF DESCRIPTION OF THE DRAWINGS

These and/or other aspects will become apparent and more readily appreciated from the following description of some example embodiments, taken in conjunction with the accompanying drawings in which.

DETAILED DESCRIPTION

Figure 1:
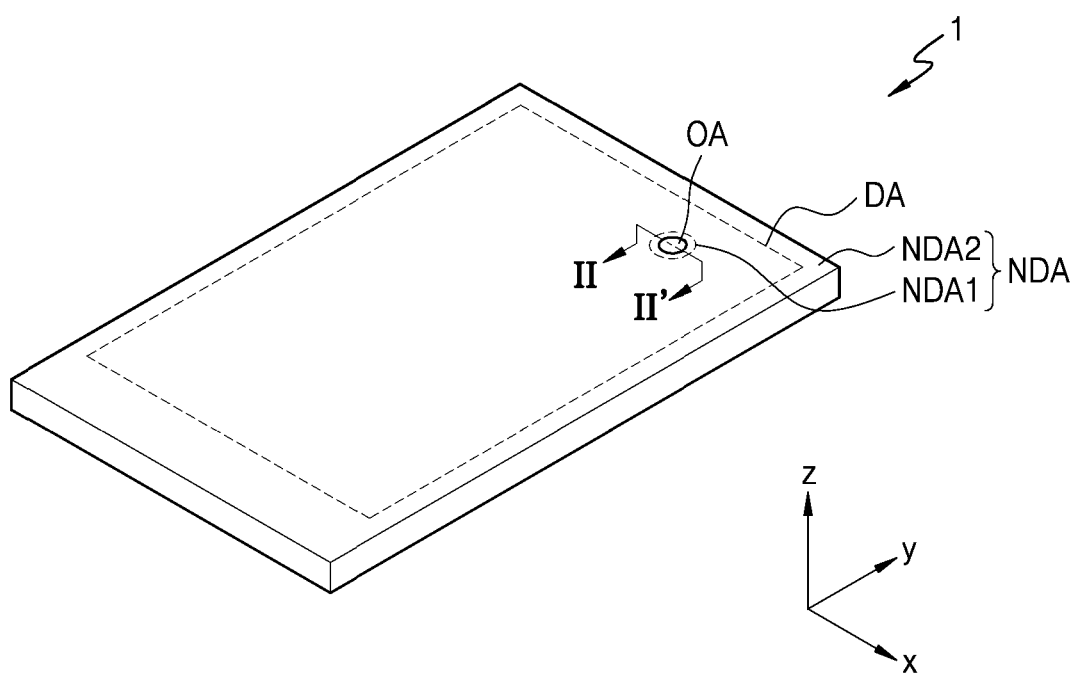
FIG. 1 is a perspective view of a display device according to an embodiment.

Reference will now be made in further detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Expressions such as "at least one of," when preceding a list of elements, modify the entire list of elements and do not modify the individual elements of the list.

Since the present disclosure may have various modified embodiments, some example embodiments are illustrated in the drawings and are described in the detailed description. An effect and a characteristic of the present disclosure, and a method of accomplishing these will be apparent when referring to embodiments described with reference to the drawings. The present disclosure may, however, be embodied in many different forms and should not be construed as limited to the embodiments set forth herein.

It is to be understood that although the terms "first," "second," etc. may be used herein to describe various components, these components should not be limited by these terms.

An expression used in the singular encompasses the expression of the plural, unless it has a clearly different meaning in the context.

It is to be further understood that the terms "comprises" and/or "comprising" used herein specify the presence of stated features or components, but do not preclude the presence or addition of one or more other features or components.

It is to be understood that when a layer, region, or component is referred to as being "formed on" another layer, region, or component, it may be directly or indirectly formed on the other layer, region, or component. That is, for example, one or more intervening layers, regions, or components may be present.

Sizes of components in the drawings may be exaggerated for convenience of explanation. In other words, since sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It is to be understood that when a layer, region, or component is connected to another portion, the layer, region, or component may be directly connected to the portion or one or more intervening layers, regions, or components may exist. For example, when a layer, region, or component is electrically connected to another portion, the layer, region, or component may be directly electrically connected to the portion or may be indirectly connected to the portion through another layer, region, or component.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view of a display device according to an embodiment.

Referring to FIG. 1, a display device 1 includes a display area DA for emitting light and a non-display area NDA for not emitting light. The non-display area NDA is adjacent to the display area DA. The display device 1 may provide a certain image using light emitted from a plurality of pixels arranged in the display area DA.

The display device 1 includes an opening area OA at least partly surrounded by the display area DA. In an embodiment, as shown in FIG. 1, the opening area OA is entirely surrounded by the display area DA. The non-display area NDA may include a first non-display area NDA1 surrounding the opening area OA and a second non-display area NDA2 surrounding an outer periphery of the display area DA. In an embodiment, the first non-display area NDA1 may entirely surround the opening area OA, the display area DA may entirely surround the first non-display area NDA1, and the second non-display area NDA2 may entirely surround the display area DA.

Herein, an organic light-emitting display is described as an example of the display device 1 according to an embodiment, but a display device of the present disclosure is not limited thereto. As another embodiment, any of various display devices, such as an inorganic electroluminescent (EL) display and a quantum dot EL display, may be used.

Figure 2:
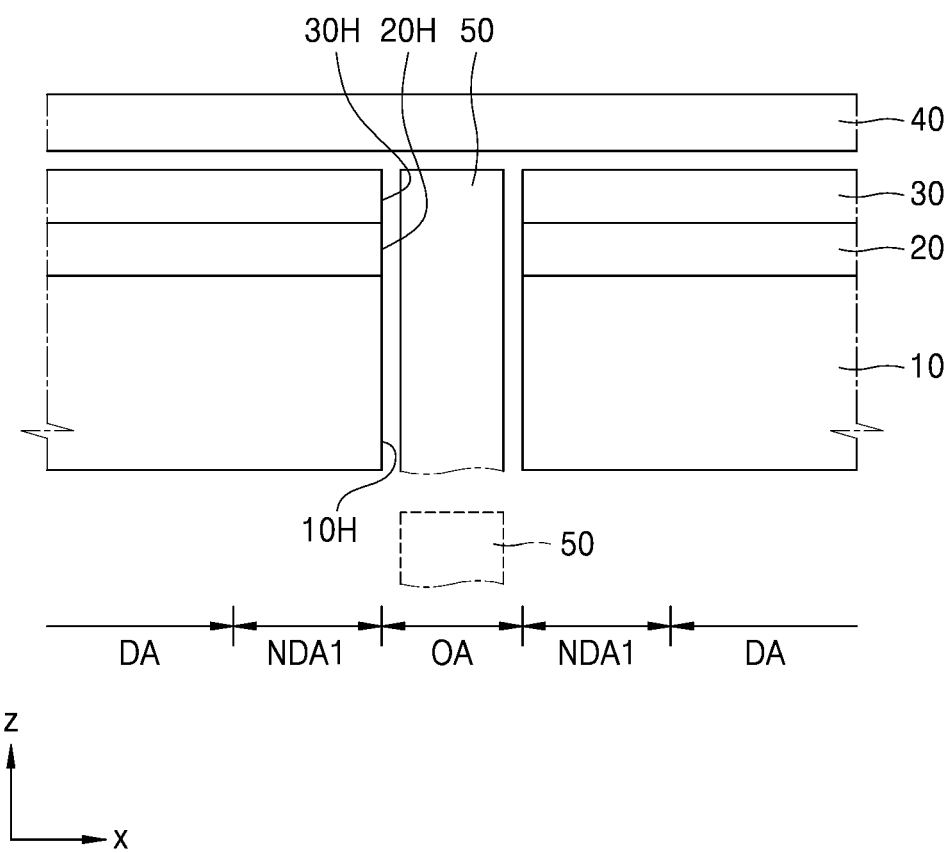
FIG. 2 is a cross-sectional view of a display device according to an embodiment.

FIG. 2 is a cross-sectional view schematically showing a display device according to an embodiment, and may correspond to a cross-section taken along the line II-II' in FIG. 1.

Referring to FIG. 2, the display device 1 may include a display panel 10, an input sensing member 20 on the display panel 10, and an optical functional member 30, which may be covered with a window 40. The display device 1 may be any of a variety of electronic devices, such as a mobile phone, a laptop computer, and a smart watch.

The display panel 10 may display an image. The display panel 10 includes pixels arranged in the display area DA. The pixels may include a display element and a pixel circuit connected thereto. The display element may include an organic EL diode, an inorganic EL diode, or a quantum dot EL diode, for example.

The input sensing member 20 obtains coordinate information according to an external input, for example, a touch event. The input sensing member 20 may include a sensing electrode (touch electrode) and a trace line connected to the sensing electrode. The input sensing member 20 may be on the display panel 10.

The input sensing member 20 may be formed directly on the display panel 10 or may be formed separately and then coupled to the display panel 10 through an adhesive layer, such as an optical transparent adhesive (OCA). For example, the input sensing member 20 may be continuously formed after the process of forming the display panel 10, in which case the adhesive layer may not be between the input sensing member 20 and the display panel 10. FIG. 2 shows that the input sensing member 20 is between the display panel 10 and the optical functional member 30, but as another example, the input sensing member 20 may be on the optical functional member 30.

In an embodiment, the optical functional member 30 may include an antireflective layer. The antireflective layer may reduce the reflectance of light (external light) incident from the outside toward the display panel 10 through the window 40. The antireflective layer may include a retarder and a polarizer. The retarder may be of a film type or a liquid crystal coating type and may include a λ/2 retarder and/or a λ/4 retarder. The polarizer may also be of a film type or a liquid crystal coating type. The film type may include a stretch-type synthetic resin film, and the liquid crystal coating type may include liquid crystals arranged in a certain arrangement. The retarder and the polarizer may further include a protective film. The retarder and the polarizer or the protective film may be defined as a base layer of the antireflective layer.

In another embodiment, the antireflective layer may include a black matrix and color filters. The color filters may be arranged considering the color of light emitted from each of the pixels of the display panel 10. In another embodiment, the antireflective layer may include a destructive interference structure. The destructive interference structure may include a first reflective layer and a second reflective layer on respective layers. First reflected light and second reflected light respectively reflected by the first reflective layer and the second reflective layer may destructively interfere, and, thus, external light reflectance may be reduced.

In an embodiment, the optical functional member 30 may include a lens layer. The lens layer may improve luminous efficiency light emitted from the display panel 10 or may reduce color deviation. The lens layer may include a layer having a concave or convex lens shape and/or may include a plurality of layers having different refractive indices. The optical functional member 30 may include all or some of the above-described antireflective layer and lens layer.

The display panel 10, the input sensing member 20, and the optical functional member 30 may include an opening. In this regard, FIG. 2 shows that the display panel 10, the input sensing member 20, and the optical functional member 30 include first to third openings 10H, 20H, and 30H, respectively, and the first to third openings 10H, 20H, and 30H overlap each other. The first to third openings 10H, 20H, and 30H are located to correspond to the opening area OA. In another embodiment, at least one of the display panel 10, the input sensing member 20, and/or the optical functional member 30 may not include an opening. For example, one or two components selected from the display panel 10, the input sensing member 20, and the optical functional member 30 may not include an opening.

A component 50 may correspond to the opening area OA. The component 50 may be in the first to third openings 10H, 20H, and 30H as shown by solid lines in FIG. 2, or may be under the display panel 10 as shown by dashed lines in FIG. 2.

The component 50 may include an electronic component. For example, the component 50 may include an electronic component utilizing light or sound. For example, the electronic component may include any of a sensor that receives light, such as an infrared sensor, a camera that captures an image by receiving light, a sensor that outputs and detects light and sound to measure distance or recognize fingerprints, a small lamp that outputs light, a speaker that outputs sound, and the like. In the case of an electronic component using light, light of various wavelength bands, such as visible light, infrared light, ultraviolet light, and the like, may be used. In some embodiments, the opening area OA may be understood as a transmission area in which light and/or sound that is output from the component 50 to the outside or that travels from the outside toward the electronic component may be transmitted.

In another embodiment, when the display device 1 is used as a smart watch or a vehicle instrument panel, the component 50 may be a member including a clock needle or a needle indicating certain information (e.g., vehicle speed, etc.). When the display device 1 includes a clock needle or a vehicle instrument panel, the component 50 may be exposed to the outside through the window 40, and the window 40 may include an opening corresponding to the opening area OA.

The component 50 may include one or more components associated with the function of the display panel 10 as described above, or may include any of components, such as accessories, that increase aesthetics of the display panel 10.

Figure 3:
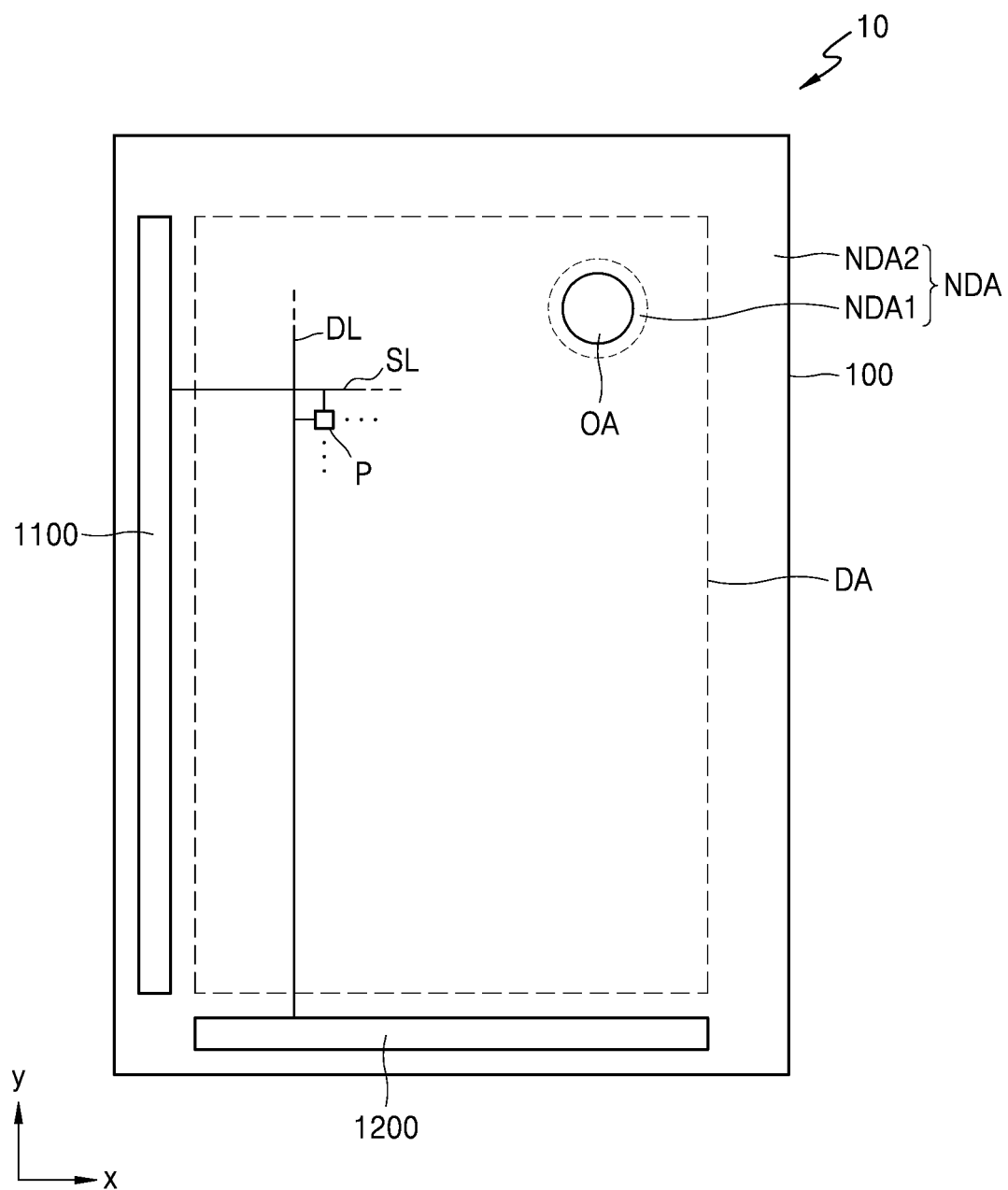
FIG. 3 is a plan view of a display panel according to an embodiment.
Figure 4:
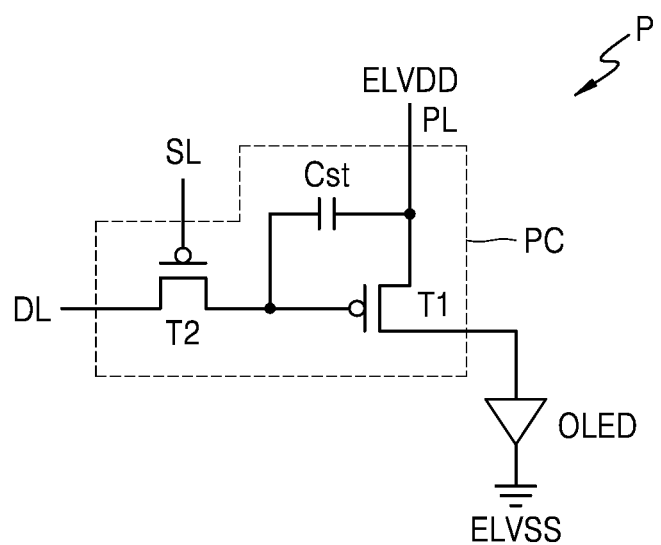
FIG. 4 is an equivalent circuit diagram of a pixel of a display panel.

FIG. 3 is a plan view of a display panel according to an embodiment; and FIG. 4 is an equivalent circuit diagram of a pixel of the display panel.

Referring to FIG. 3, the display panel 10 includes the display area DA and the first and second non-display areas NDA1 and NDA2. FIG. 3 may be understood as a view of a substrate 100 of the display panel 10. For example, it may be understood that the substrate 100 has the opening area OA, the display area DA, and the first and second non-display areas NDA1 and NDA2.

The display panel 10 includes a plurality of pixels P arranged in the display area DA. Each pixel P, as shown in FIG. 4, includes a pixel circuit PC and an organic light-emitting diode OLED as a display element connected to the pixel circuit PC. The pixel circuit PC may include a first thin-film transistor T1, a second thin-film transistor T2, and a storage capacitor Cst. Each pixel P may emit light of, for example, red, green, blue, or white through the organic light-emitting diode OLED.

The second thin-film transistor T2 is a switching thin-film transistor which is connected to a scan line SL and a data line DL and may transfer data voltage input from the data line DL to the first thin-film transistor T1 according to a switching voltage input from the scan line SL. The storage capacitor Cst is connected to the second thin-film transistor T2 and a driving voltage line PL and may store a voltage corresponding to a difference between a voltage received from the second thin-film transistor T2 and a first power supply voltage ELVDD supplied to the driving voltage line PL.

The first thin-film transistor T1 is a driving thin-film transistor which is connected to the driving voltage line PL and the storage capacitor Cst and may control a driving current flowing to the organic light-emitting diode OLED from the driving voltage line PL corresponding to a voltage value stored in the storage capacitor Cst. The organic light-emitting diode OLED may emit light having certain luminance according to the driving current. An opposite electrode (e.g., cathode) of the organic light-emitting diode OLED may be supplied with a second power supply voltage ELVSS.

FIG. 4 illustrates that the pixel circuit PC includes two thin-film transistors and one storage capacitor, but the present disclosure is not limited thereto. The number of thin-film transistors and the number of storage capacitors may be variously changed according to the design of the pixel circuit PC.

Referring again to FIG. 3, the first non-display area NDA1 may surround the opening area OA. The first non-display area NDA1 is an area in which a display element, such as an organic light-emitting diode that emits light, is not disposed. In the first non-display area NDA1, signal lines that provide signals to the pixels P provided around the opening area OA may pass or groove(s) to be described later below may be disposed. The second non-display area NDA2 may include a scan driver 1100 for providing a scan signal to each pixel P, a data driver 1200 for providing a data signal to each pixel P, and a main power wire (not shown) for providing first and second power supply voltages. FIG. 3 shows that the data driver 1200 is adjacent to one side of the substrate 100. According to another embodiment, the data driver 1200 may be on a flexible printed circuit board (FPCB) electrically connected to a pad on one side of the display panel 10.

Figure 5:
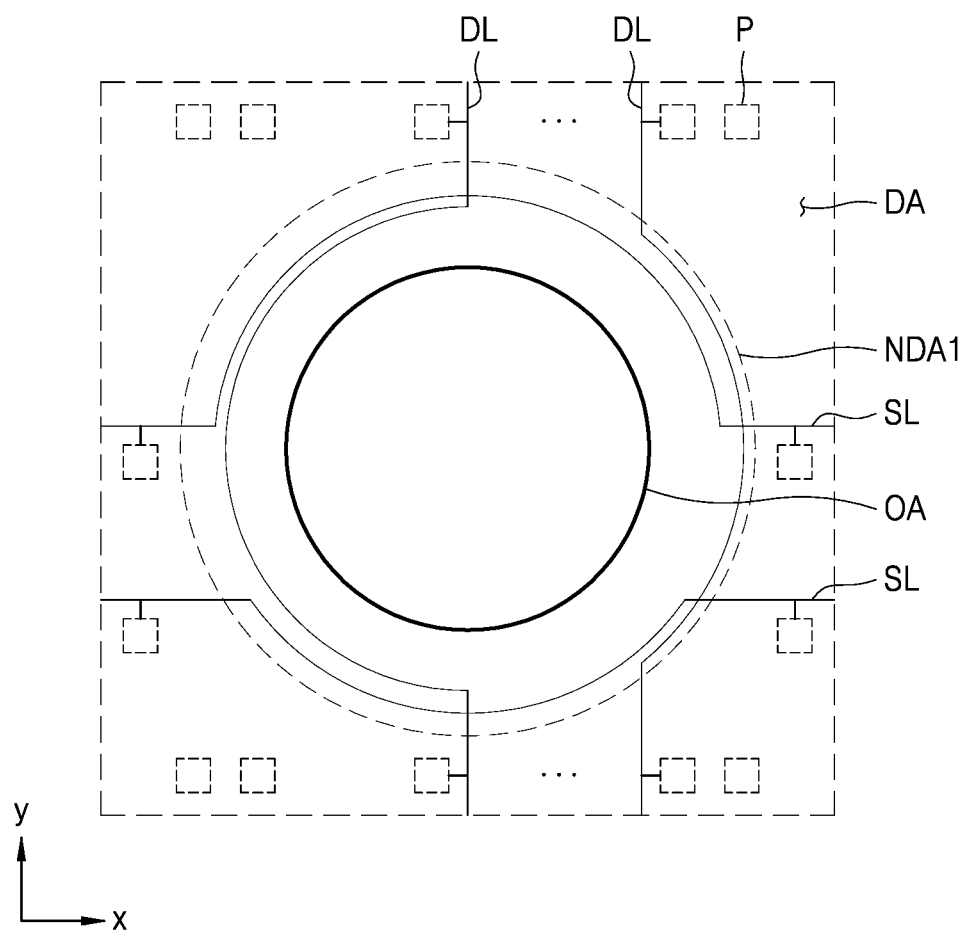
FIG. 5 is a view of signal lines located in a first non-display area of a display panel according to an embodiment.

FIG. 5 is a plan view showing a portion of a display panel according to an embodiment, showing signal lines located in the first non-display area NDA1.

Referring to FIG. 5, pixels P are arranged in the display area DA with the opening area OA as a center, and the first non-display area NDA1 may be between the opening area OA and the display area DA.

The pixels P may be apart from each other around the opening area OA. The pixels P may be spaced upward and downward around the opening area OA, and/or may be spaced laterally around the opening area OA.

Signal lines adjacent to the opening area OA from among signal lines supplying signals to the pixels P may bypass the opening area OA. Some of data lines DL passing through the display area DA extend in a y direction to provide data signals to the pixels P arranged above and below the opening area OA and may bypass along an edge of the opening area OA in the first non-display area NDA1. Some of the scan lines SL passing through the display area DA extend in an x direction to provide scan signals to the pixels P arranged on right and left sides of the opening area OA and may bypass along an edge of the opening area OA in the first non-display area NDA1.

Figure 6:
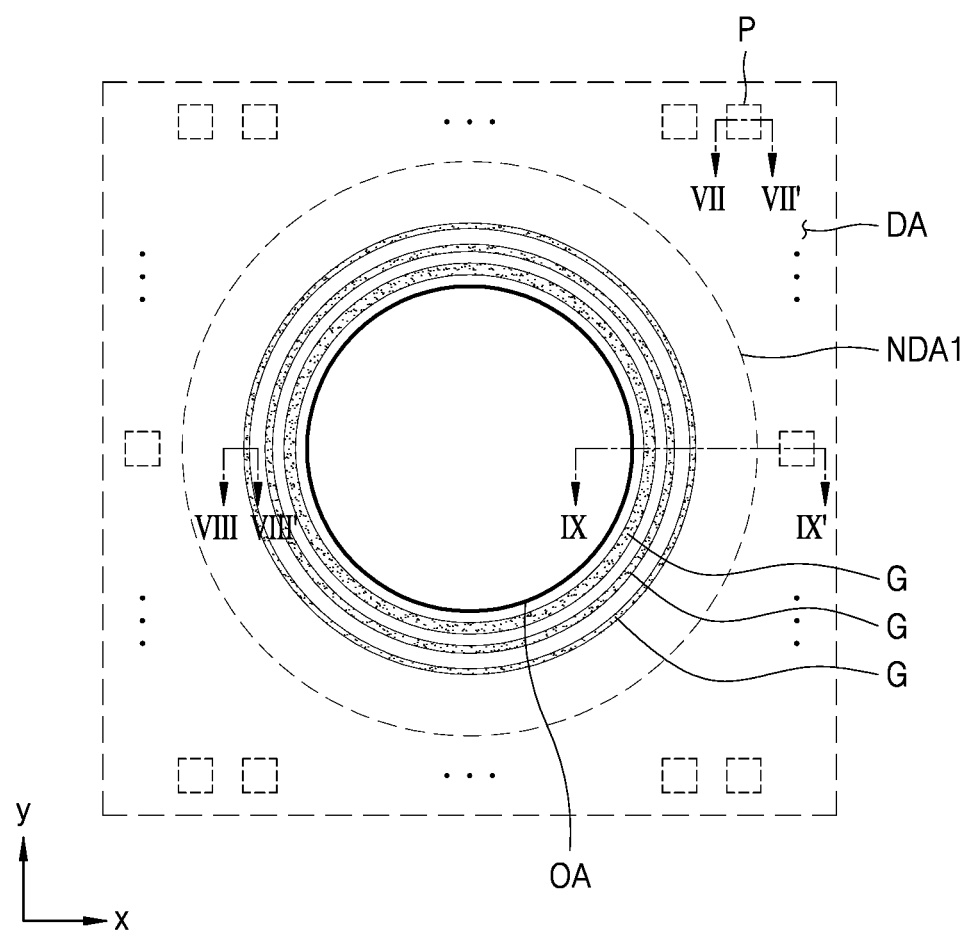
FIG. 6 is a view of grooves located in a first non-display area of a display panel according to an embodiment.

FIG. 6 is a plan view showing a portion of a display panel according to an embodiment, showing a groove located in a first non-display area.

One or more grooves are located between the opening area OA and the display area DA. In this regard, FIG. 6 shows that three grooves G are located between the opening area OA and the display area DA, but the present disclosure is not limited thereto. In another embodiment, one, two, or four or more grooves may be arranged in the first non-display area NDA1.

In an embodiment, the grooves G may be annular in the first non-display area NDA1 to entirely surround the opening area OA. The diameter of each of the grooves G may be formed greater than the diameter of the opening area OA. The grooves G surrounding the opening area OA in the plane may be spaced apart by a certain distance.

Referring to FIGS. 5 and 6, the grooves G may be closer to the opening area OA than bypass areas of a data line or/and a scan line that bypass an edge of the opening area OA.

Figure 7:
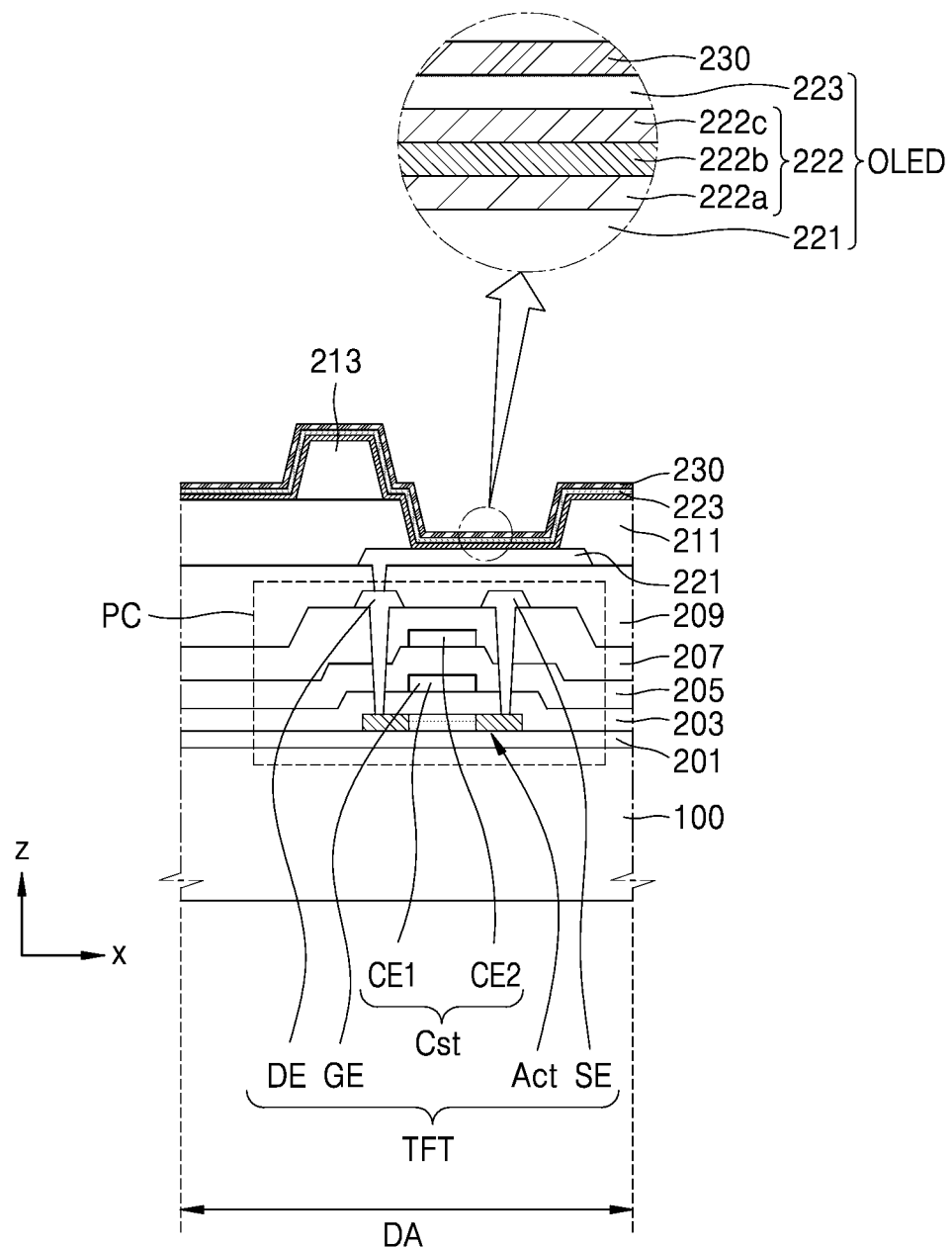
FIG. 7 is a cross-sectional view of a pixel of a display panel according to an embodiment.

FIG. 7 is a cross-sectional view of a pixel included in a display panel according to an embodiment, and may correspond to a cross-section taken along the line VII-VII' in FIG. 6.

Referring to FIG. 7, the display area DA may include the pixel circuit PC and the organic light-emitting diode OLED electrically connected to the pixel circuit PC.

A thin-film transistor TFT and the storage capacitor Cst on the substrate 100 and a pixel electrode 221 electrically connected to the thin-film transistor TFT and the storage capacitor Cst are formed. The pixel circuit PC may be on the substrate 100, and the organic light-emitting diode OLED may be on the pixel circuit PC.

The substrate 100 may include a polymer resin or glass. In an embodiment, the substrate 100 may include a polymer resin, such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), and/or cellulose acetate propionate (CAP), and may be flexible. The substrate 100 may include a glass material including $SiO_2$ as a main component, or a resin, such as a reinforced plastic, and may be rigid.

A buffer layer 201 may be formed on the substrate 100 to prevent or substantially prevent impurities from penetrating into a semiconductor layer Act of the thin-film transistor TFT. In an embodiment, the buffer layer 201 may include an inorganic insulating material, such as silicon oxide (SiNx) or silicon nitride (SiOx), and may include a single layer or multiple layers including the inorganic insulating material described above.

The pixel circuit PC may be on the buffer layer 201. The pixel circuit PC includes the thin-film transistor TFT and the storage capacitor Cst. The thin film transistor TFT may include the semiconductor layer Act, a gate electrode GE, a source electrode SE, and a drain electrode DE. The thin-film transistor TFT shown in FIG. 7 may correspond to the driving thin-film transistor described with reference to FIG. 4. The present embodiment shows a top gate type in which the gate electrode GE is on the semiconductor layer Act with a gate insulating layer 203 as a center. However, according to another embodiment, the thin-film transistor TFT may be a bottom gate type.

In an embodiment, the semiconductor layer Act may include polysilicon. In another embodiment, the semiconductor layer Act may include amorphous silicon, an oxide semiconductor, an organic semiconductor, or the like. The gate electrode GE may include a low resistance metal material. The gate electrode GE may include a conductive material including molybdenum (Mo), aluminum (Al), copper (Cu), titanium (Ti), or the like, and may be formed as a single layer or multiple layers including the above-described materials.

The gate insulating layer 203 between the semiconductor layer Act and the gate electrode GE may include an inorganic insulating material, such as any of silicon oxide, silicon nitride, silicon oxynitride, aluminum oxide, titanium oxide, tantalum oxide, hafnium oxide, and the like. The gate insulating layer 203 may include a single layer or multiple layers including the above-described materials.

The source electrode SE and the drain electrode DE may include a material having good conductivity. The source electrode SE and the drain electrode DE may include a conductive material including Mo, Al, Cu, Ti, or the like, and may be formed as a single layer or multiple layers including the above-described materials. In an embodiment, the source electrode SE and the drain electrode DE may include multiple layers of Ti/Al/Ti.

The storage capacitor Cst includes a lower electrode CE1 and an upper electrode CE2 which overlap each other with a first interlayer insulating layer 205 therebetween. The storage capacitor Cst may overlap the thin-film transistor TFT. In this regard, FIG. 7 shows that the gate electrode GE of the thin film transistor TFT is the lower electrode CE1 of the storage capacitor Cst. In another embodiment, the storage capacitor Cst may not overlap the thin film transistor TFT. The storage capacitor Cst may be covered with a second interlayer insulating layer 207.

In an embodiment, the first and second interlayer insulating layers 205 and 207 may include an inorganic insulating material, such as any of silicon oxide, silicon nitride, silicon oxynitride, aluminum oxide, titanium oxide, tantalum oxide, hafnium oxide, and the like. The first and second interlayer insulating layers 205 and 207 may include a single layer or multiple layers including the above-described materials.

The pixel circuit PC including the thin film transistor TFT and the storage capacitor Cst may be covered with a planarization layer 209. The planarization layer 209 may include an approximately planar top surface. In an embodiment, the planarization layer 209 may include an organic insulation material, such as a general commercial polymer such as any of polymethyl methacrylate (PMMA) or polystyrene (PS), a polymer derivative including a phenolic group, an acrylic polymer, an imide polymer, an aryl ether polymer, an amide polymer, a fluorine-based polymer, a p-xylene-based polymer, a vinyl alcohol polymer, and a blend thereof. In an embodiment, the planarization layer 209 may include polyimide. In another embodiment, the planarization layer 209 may include an inorganic insulating material, or may include inorganic and organic insulating materials.

The pixel electrode 221 may be formed on the planarization layer 209. The pixel electrode 221 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 221 may include a reflective layer including silver (Ag), magnesium (Mg), Al, platinum (Pt), palladium (Pd), gold (Au), nickel (Ni), neodymium (Nd), iridium (Ir), chromium (Cr), or a compound thereof. In another embodiment, the pixel electrode 221 may further include a film formed of ITO, IZO, ZnO, or $In_2O_3$ above/below the reflective film.

A pixel defining layer 211 may be formed on the pixel electrode 221. The pixel defining layer 211 may include an opening exposing an upper surface of the pixel electrode 221 and may cover an edge of the pixel electrode 221. Accordingly, the pixel defining layer 211 may define a light-emitting region of a pixel. In an embodiment, the pixel defining layer 211 may include an organic insulating material. In another embodiment, the pixel defining layer 211 may include an inorganic insulating material, such as silicon nitride (SiNx), silicon oxynitride (SiON), or silicon oxide (SiOx). In another embodiment, the pixel defining layer 211 may include an organic insulating material and an inorganic insulating material.

An intermediate layer 222 includes an emission layer 222b. The intermediate layer 222 may include a first functional layer 222a under the emission layer 222b and/or a second functional layer 222c on the emission layer 222b. The emission layer 222b may include a polymer organic material or a low molecular weight organic material that emits light of a certain color.

The first functional layer 222a may include a single layer or multiple layers. For example, when the first functional layer 222a includes a polymer material, the first functional layer 222a may include a hole transport layer (HTL) having a single-layer structure and may include 3,4-ethylene-dihydroxythiophene (PEDOT) or polyaniline (PANI). When the first functional layer 222a is formed of a low molecular weight material, the first functional layer 222a may include a hole injection layer (HIL) and a hole transport layer (HTL).

In some embodiments, the second functional layer 222c is present. For example, when the first functional layer 222a and the emission layer 222b include a polymer material, the second functional layer 222c may be formed. The second functional layer 222c may include a single layer or multiple layers. The second functional layer 222c may include an electron transport layer (ETL) and/or an electron injection layer (EIL).

The emission layer 222b in the intermediate layer 222 may be arranged for each pixel in the display area DA. The emission layer 222b may contact the upper surface of the pixel electrode 221 exposed through an opening of the pixel defining layer 211. In an embodiment, the first and second functional layers 222a and 222c in the intermediate layer 222 may be formed not only in the display area DA of FIG. 7 but also in the first non-display area NDA1.

The opposite electrode 223 may include a conductive material having a low work function. For example, the opposite electrode 223 may include a (semi) transparent layer including Ag, Mg, Al, Pt, Pd, Au, Ni, Nd, Ir, Cr, or an alloy thereof. In an embodiment, the opposite electrode 223 may further include a layer such as ITO, IZO, ZnO, or $In_2O_3$ on the (semi) transparent layer including the above-mentioned material. In an embodiment, the opposite electrode 223 may be formed not only in the display area DA but also in the first non-display area NDA1. In an embodiment, the intermediate layer 222 and the opposite electrode 223 may be formed by thermal evaporation.

In an embodiment, a spacer 213 may be formed on the pixel defining layer 211. The spacer 213 may include an organic insulating material, such as polyimide. In another embodiment, the spacer 213 may include an inorganic insulating material, such as silicon nitride or silicon oxide, or may include an organic insulating material and an inorganic insulating material.

In an embodiment, the spacer 213 may include a material different from the pixel defining layer 211. In another embodiment, the spacer 213 may include a same material as that of the pixel defining layer 211. In this case, the pixel defining layer 211 and the spacer 213 may be formed together in a mask process using a halftone mask or the like. In an embodiment, the pixel defining layer 211 and the spacer 213 may include polyimide.

A capping layer 230 may be on the opposite electrode 223. The capping layer 230 protects the opposite electrode 223, and may include LiF, an inorganic material, and/or an organic material. In an embodiment, the capping layer 230 may be omitted.

Figure 8:
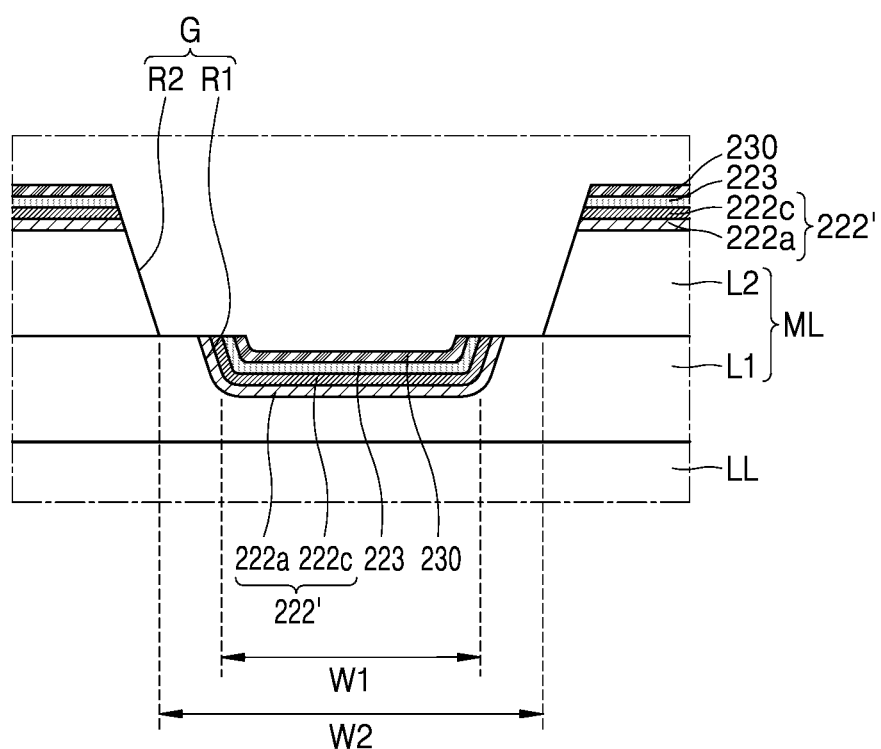
FIG. 8 is a cross-sectional view of a portion of a display panel according to an embodiment.

FIG. 8 is a cross-sectional view of a groove in a display panel according to an embodiment, and may correspond to a cross-section taken along the line VIII-VIII' in FIG. 6.

Referring to FIG. 8, a groove G is formed in a multilayer film ML. The multilayer film ML includes at least two layers having different materials. The multilayer film ML may include an organic insulating material, such as a polymer resin and/or an inorganic insulating material, such as silicon nitride, silicon oxynitride, or silicon oxide. In an embodiment, the multilayer film ML may include a metal. The multilayer film ML may include a first layer L1 and a second layer L2 stacked on a lower layer LL. Each of the first layer L1 and the second layer L2 may have a single layer structure or a multilayer structure.

The multilayer film ML of FIG. 8 may correspond to a portion of the components of the display panel described above with reference to FIG. 7. For example, the multilayer film ML may be a sublayer of the substrate 100 described with reference to FIG. 7. In an embodiment, the multilayer film ML may correspond to layers constituting the display panel, for example, a portion of layers on the substrate 100.

The grooves G may be formed along a depth direction of the multilayer film ML. In the present embodiment, the groove G has steps in the form of stairs on its side surface. The groove G may include a first recessed portion R1 formed in the first layer L1 and a second recessed portion R2 formed in the second layer L2 so as to overlap the first recessed portion R1. The first recessed portion R1 of the groove G has a first width W1, and the second recessed portion R2 has a second width W2 that is greater than the first width W1 such that the groove G has steps in the form of stairs on its side surface. Here, the first width W1 and the second width W2 may be defined as the narrowest widths of widths of the first recessed portion R1 and the second recessed portion R2, respectively.

In an embodiment, the first recessed portion R1 may be formed as a concave recess in a thickness direction of the first layer L1 by etching the first layer L1, and the second recessed portion R2 may be formed as a hole penetrating the second layer L2 by etching the second layer L2. The first recessed portion R1 and the second recessed portion R2 may be spatially connected to form the groove G. The above-described etching may be isotropic etching and/or anisotropic etching.

In the present embodiment, the groove G may prevent or substantially prevent water or the like from penetrating into an organic light-emitting diode of the display area DA. That is, a sublayer 222', the opposite electrode 223, and the capping layer 230 of an intermediate layer may be disconnected by, or discontinuous across, the groove G. In this regard, FIG. 8 shows that the first and second functional layers 222a and 222c, the opposite electrode 223, and the capping layer 230 are disconnected by or cut off around the second recessed portion R2 of the groove G.

If the first and second functional layers 222a and 222c including the organic material are not disconnected, due to the nature of the organic material, moisture may permeate the organic light-emitting diode of the display area through the first and second functional layers 222a and 222c.

Accordingly, in the present embodiment, the first and second functional layers 222a and 222c including the organic material are disconnected around the groove G to prevent or substantially prevent moisture from penetrating into the display area DA.

In FIG. 8, since the first and second functional layers 222a and 222c, the opposite electrode 223, and the capping layer 230 are disconnected around the second recessed portion R2, the first and second functional layers 222a and 222c, the opposite electrode 223, and the capping layer 230 may be sequentially stacked on an upper surface of the second layer L2. The first and second functional layers 222a and 222c, the opposite electrode 223, and the capping layer 230 may also be sequentially stacked on an inner portion and inner walls of the first recessed portion R1.

Since the second width W2 of the second recessed portion R2 is greater than the first width W1 of the first recessed portion R1, the second recessed portion R2 may expose a portion of an upper surface of the first layer L1, and the first layer L1 and the second layer L2 may have a stepped shape. Here, the first and second functional layers 222a and 222c, the opposite electrode 223, and the capping layer 230 may not be on the exposed upper surface of the first layer L1.

In an embodiment, the first and second functional layers 222a and 222c, the opposite electrode 223, and the capping layer 230 inside the groove G may be disconnected by an etching process for forming the second recessed portion R2. Accordingly, a portion of the surface of the first and second functional layers 222a and 222c, the opposite electrode 223, and the capping layer 230, which are disposed in the first recessed portion R1, may be flush with the upper surface of the first layer L1.

Figure 9A:
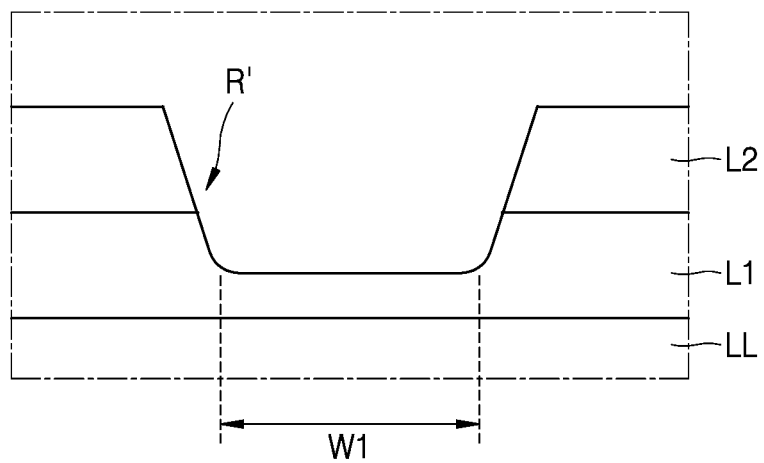
FIGS. 9A to 9C are cross-sectional views showing a method of manufacturing the display panel of FIG. 8, according to an embodiment.
Figure 9B:
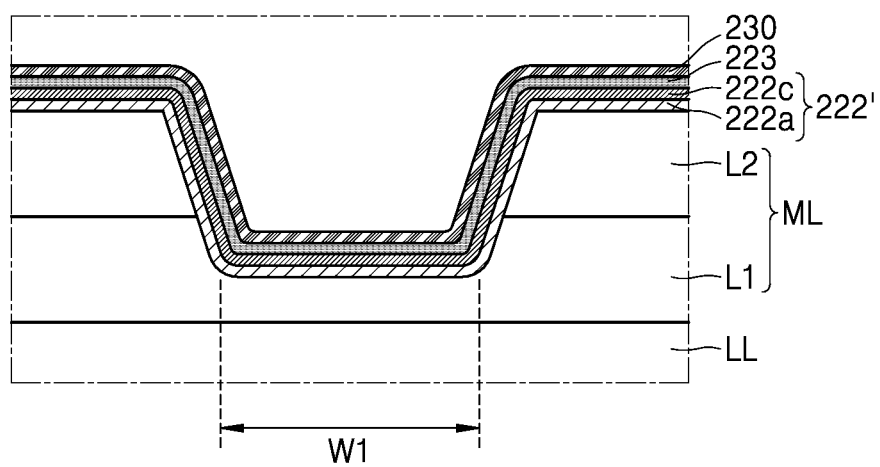
Figure 9C:
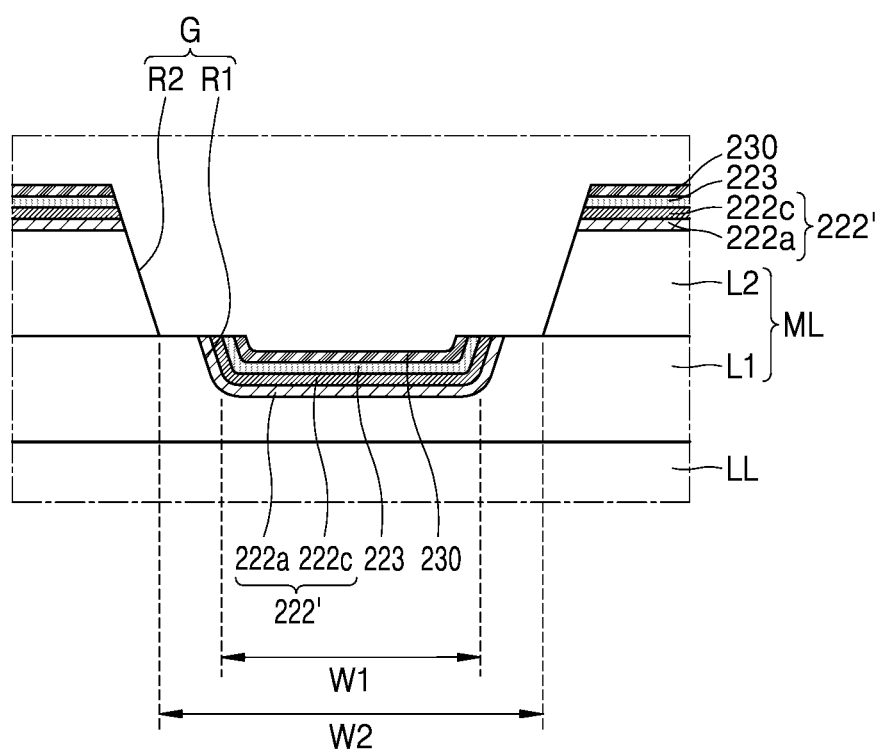

FIGS. 9A to 9C are schematic cross-sectional views sequentially illustrating a method of forming the groove G of FIG. 8, according to an embodiment.

First, referring to FIG. 9A, a pre-recess R' having the first width W1 is formed in the first layer L1 and the second layer L2. The pre-recess R' may be formed such that the second layer L2 is entirely penetrated by first etching and the first layer L1 is partially removed in a depth direction. In an embodiment, the first etching may be dry etching, and may be isotropic etching and/or anisotropic etching.

Next, referring to FIG. 9B, the first and second functional layers 222a and 222c, the opposite electrode 223, and the capping layer 230 are sequentially formed to fill the pre-recess R'. In an embodiment, the first and second functional layers 222a and 222c, the opposite electrode 223, and the capping layer 230 may be formed by thermal evaporation.

Referring to FIG. 9C, the second recessed portion R2 having the second width W2 is formed in the second layer L2, the second width W2 being greater than the first width W1. The second recessed portion R2 is formed so as to overlap the first recessed portion R1. In an embodiment, the second recessed portion R2 may be formed to completely penetrate the second layer L2 through the second etching. However, the present disclosure is not limited thereto. In another embodiment, the second recessed portion R2 may be formed so as to be only partially removed in a depth direction of the second layer L2 instead of entirely passing through the second layer L2.

In an embodiment, the second etching may be dry etching, and may be isotropic etching and/or anisotropic etching. The first and second functional layers 222a and 222c, the opposite electrode 223, and the capping layer 230 in the pre-recess R' according to the second etching are removed along with a portion of the second layer L2 to complete forming the groove G. The first and second functional layers 222a and 222c, the opposite electrode 223, and the capping layer 230 may be disconnected around the groove G.

FIGS. 10 to 13 show the periphery of a groove of a display panel according to further embodiments. In FIGS. 10 to 13, the same reference numerals as those in FIG. 8 denote the same elements, and a duplicate description thereof will be omitted for simplicity.

Figure 10:
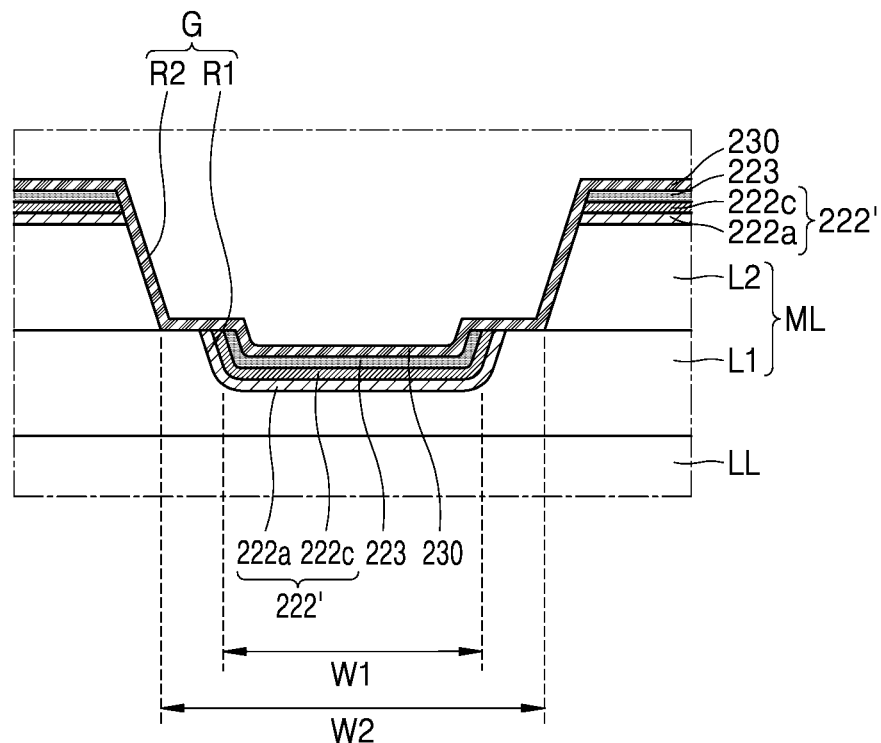
FIG. 10 is a cross-sectional view of a portion of a display panel according to another embodiment.

Referring to FIG. 10, in an embodiment, the capping layer 230 may not be disconnected around the groove G. In an embodiment, the capping layer 230 may include an inorganic insulating material, such as silicon oxide, silicon nitride, or silicon oxynitride, and the inorganic insulating material may be formed by chemical vapor deposition (CVD). Since the capping layer 230, which is an inorganic insulating material, has a relatively superior step coverage as compared with the first and second functional layers 222a and 222c and the opposite electrode 223 formed by thermal evaporation, it is possible to entirely and continuously cover the inner surface of the groove G as shown in FIG. 10.

Figure 11:
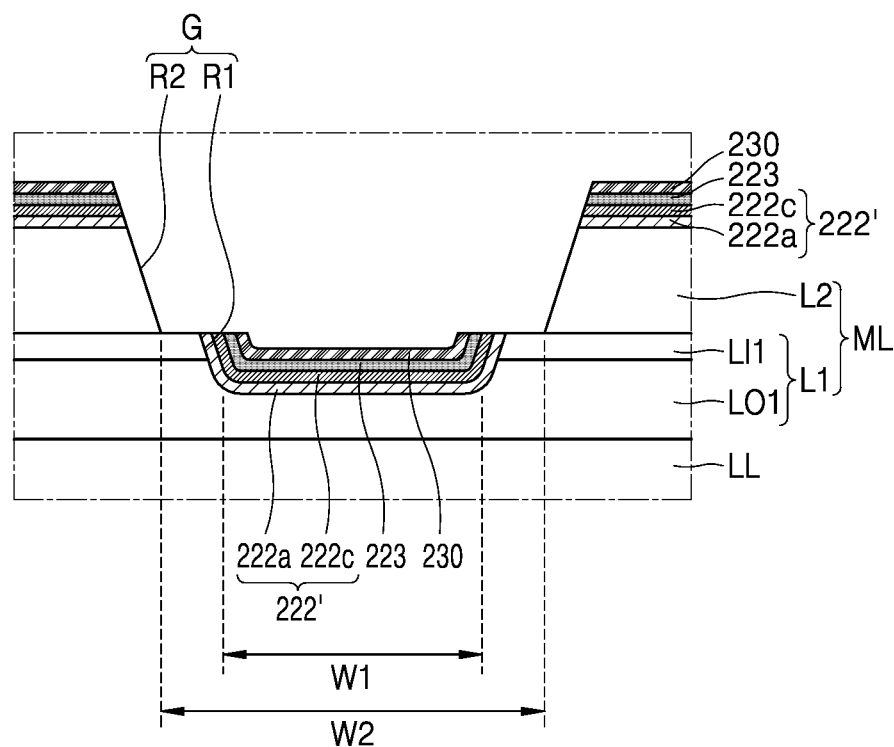
FIG. 11 is a cross-sectional view of a portion of a display panel according to another embodiment.

Referring to FIG. 11, in an embodiment, the first layer L1 may include a first organic layer LO1 including an organic material and a first inorganic layer LI1 arranged on the first organic layer LO1 and including an inorganic material. In an embodiment, the first recessed portion R1 may penetrate the first inorganic layer LI1 and the first organic layer LO1 may be only partially removed in the depth direction. The first organic layer LO1 may include a polymer resin, such as polyimide. The first inorganic layer LI1 may include an inorganic insulating material, such as silicon nitride, silicon oxynitride, or silicon oxide.

The first and second functional layers 222a and 222c, the opposite electrode 223, and the capping layer 230 may be arranged on a side surface of the first organic layer LO1 and the first inorganic layer LI1 forming an inner surface of the first recessed portion R1.

Figure 12:
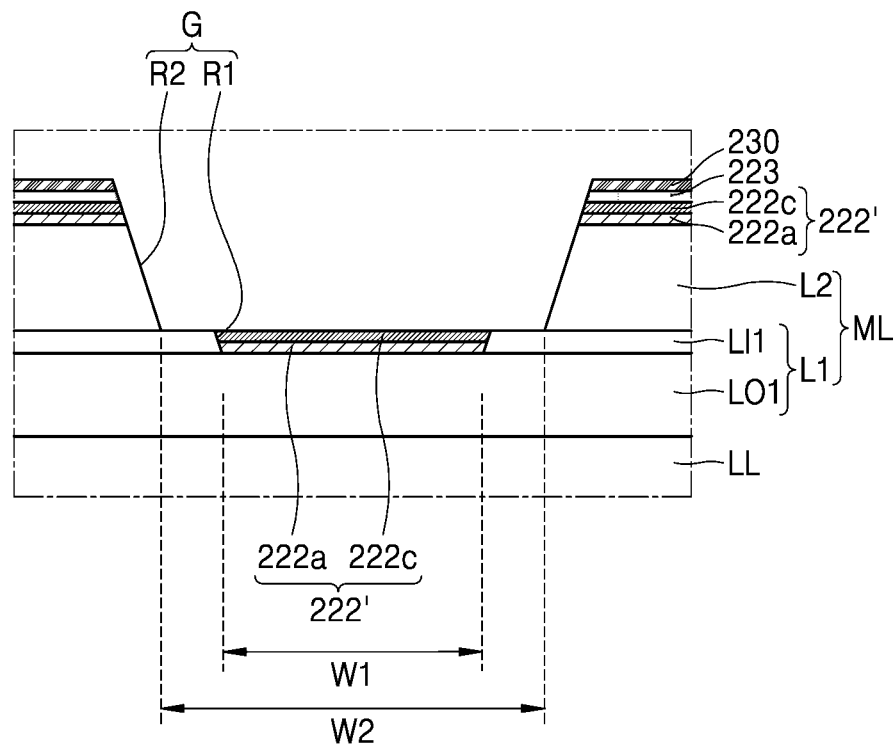
FIG. 12 is a cross-sectional view of a portion of a display panel according to another embodiment.

Referring to FIG. 12, in an embodiment, a first layer L1 may include a first organic layer LO1 including an organic material and a first inorganic layer LI1 arranged on the first organic layer LO1 and including an inorganic material. When the first layer L1 includes the first organic layer LO1 and the first inorganic layer LI1, etching conditions for the first organic layer LO1 and the first inorganic layer LI1 may be different from each other. Accordingly, the first organic layer LO1 may not be removed under the same etching conditions.

In an embodiment, the first recessed portion R1 may be formed as a hole penetrating only the first inorganic layer LI1. The first recessed portion R1 may be formed by spatially connecting a hole formed in the first inorganic layer LI1 and an upper surface of the first organic layer LO1. In an embodiment, only some of the first and second functional layers 222a and 222c, the opposite electrode 223, and the capping layer 230 may be arranged in the first recessed portion R1. In an embodiment, for example, only the first and second functional layers 222a and 222c may be arranged in the first recessed portion R1, and the opposite electrode 223 and the capping layer 230 may be removed by etching performed to form the second recessed portion R2.

In the above-described embodiments, the first and second functional layers 222a and 222c are disconnected with the second recessed portion R2 of the groove G therebetween. However, the present disclosure is not limited thereto. For example, the first and second functional layers 222a and 222c may be disconnected around the first recessed portion R1 of the groove G, as shown in FIG. 13.

Figure 13:
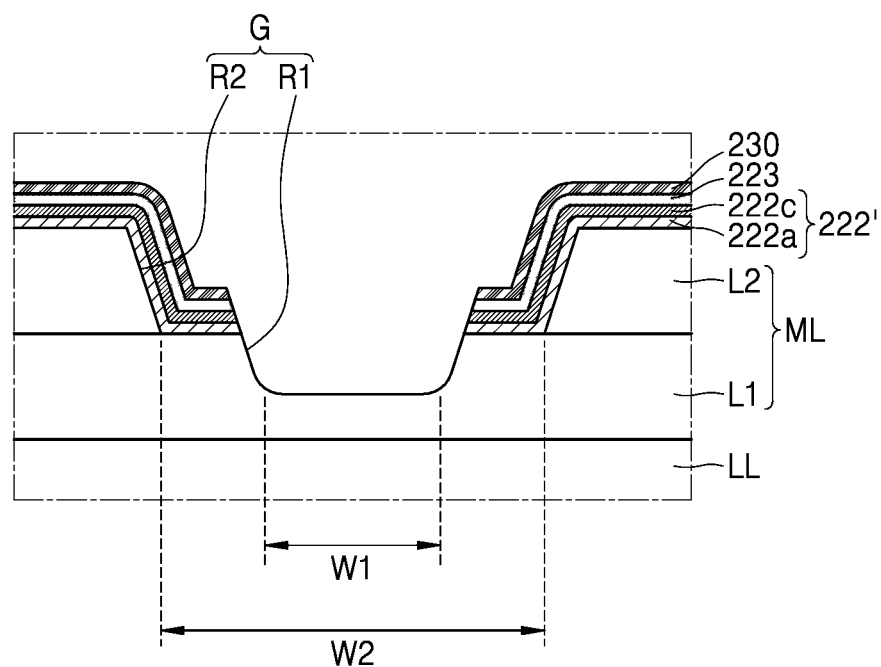
FIG. 13 is a cross-sectional view of a portion of a display panel according to another embodiment.

In an embodiment, as shown in FIG. 13, the first and second functional layers 222a and 222c may not be arranged in the first recessed portion R1, and the first and second functional layers 222a and 222c may be arranged on a side surface of the second recessed portion R2. In an embodiment, the first and second functional layers 222a and 222c may also be on an upper surface of the first layer L1 exposed by the second recessed portion R2.

The first and second functional layers 222a and 222c, the opposite electrode 223, and the capping layer 230 inside the groove G may be disconnected by an etching process for forming the first recessed portion R1. Accordingly, a portion of the surface of the first and second functional layers 222a and 222c, the opposite electrode 223, and the capping layer 230, which are arranged on the side surface of the second recessed portion R2, may be flush with an inner wall of the first recessed portion R1.

Figure 14A:
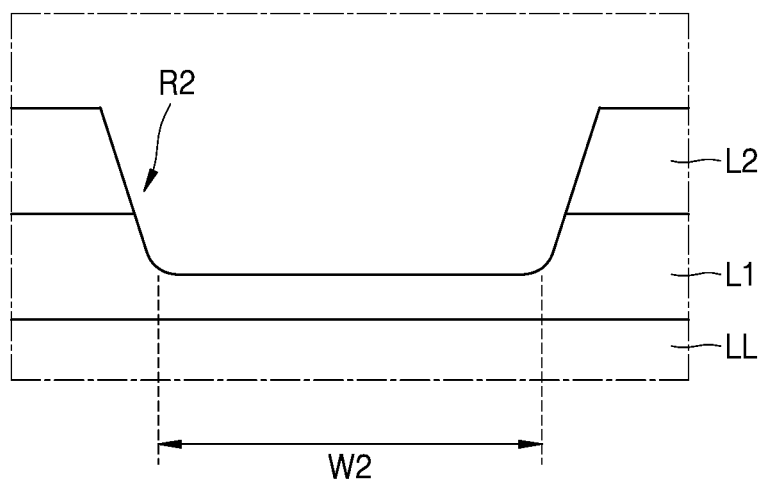
FIGS. 14A to 14C are cross-sectional views showing a method of manufacturing the display panel of FIG. 13, according to an embodiment.
Figure 14B:
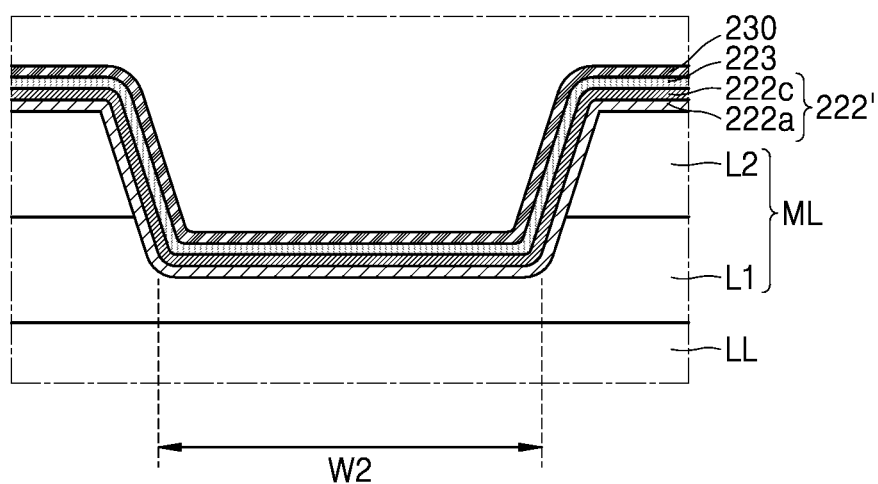
Figure 14C:
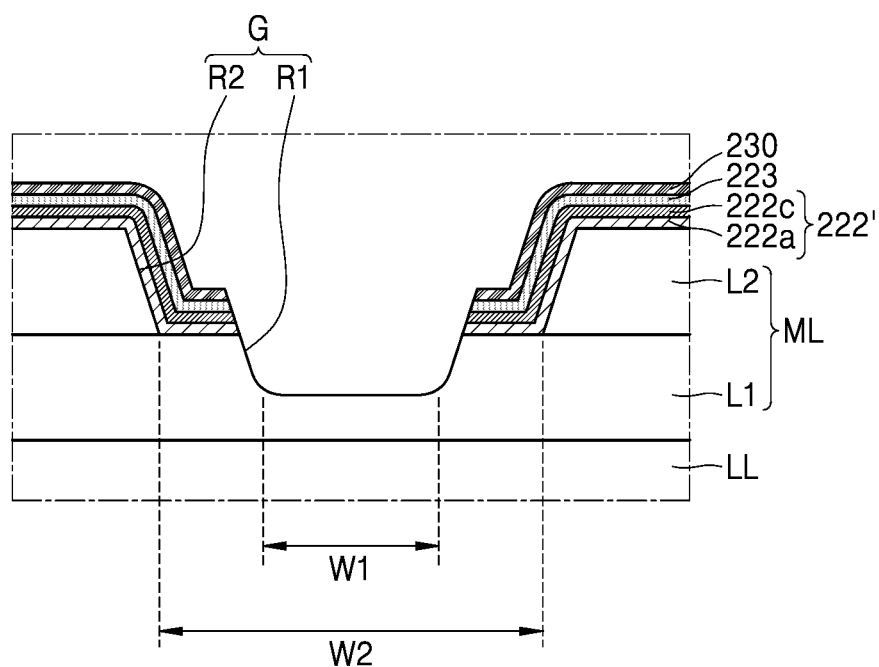

FIGS. 14A to 14C are cross-sectional views showing a method of manufacturing the groove of FIG. 13, according to an embodiment.

First, referring to FIG. 14A, the second recessed portion R2 having the second width W2 is formed in the second layer L2. The second recessed portion R2 may form a hole passing through the second layer L2 by first etching. In an embodiment, the first etching may be dry etching, and may be isotropic etching and/or anisotropic etching.

Next, referring to FIG. 14B, the first and second functional layers 222a and 222c, the opposite electrode 223, and the capping layer 230 are sequentially formed to fill the second recessed portion R2. In an embodiment, the first and second functional layers 222a and 222c, the opposite electrode 223, and the capping layer 230 may be formed by thermal evaporation.

Referring to FIG. 14C, the first recessed portion R1 having the first width W1 less than the second width W2 is formed in the first layer L1. The first recessed portion R1 is formed so as to be disposed inside the second recessed portion R2. In an embodiment, the first recessed portion R1 may be formed by partially removing the first layer L1 in the depth direction by second etching.

In an embodiment, the second etching may be dry etching, and may be isotropic etching and/or anisotropic etching. The first and second functional layers 222a and 222c, the opposite electrode 223, and the capping layer 230 in the second recessed portion R2 according to the second etching are removed along with a portion of the first layer L1 to complete forming the groove G. The first and second functional layers 222a and 222c, the opposite electrode 223, and the capping layer 230 may be disconnected around the first recessed portion R1 of the groove G.

Figure 15:
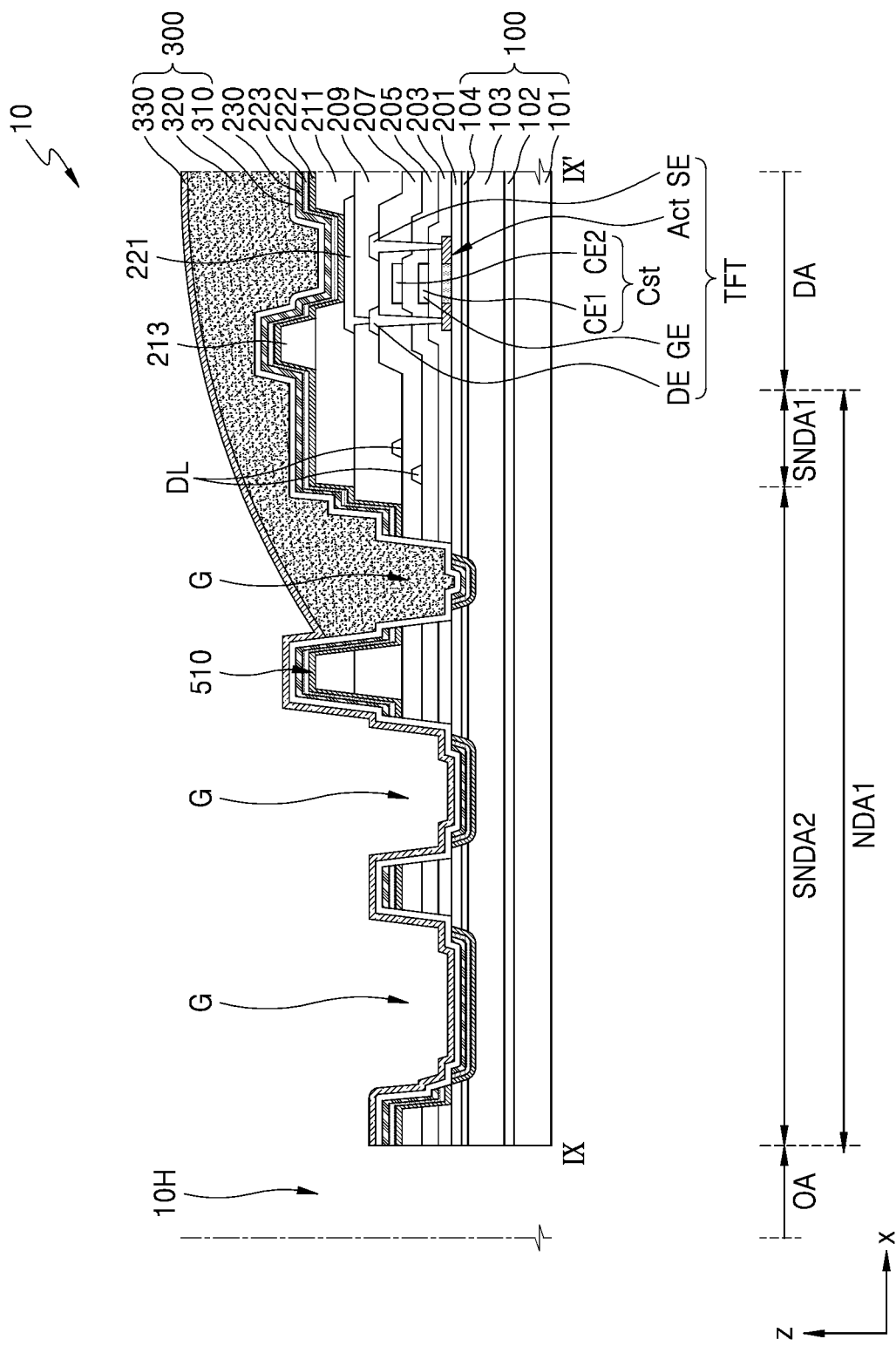
FIG. 15 is a cross-sectional view of a display panel according to an embodiment and corresponds to the line IX-IX' of FIG. 6.
Figure 16:
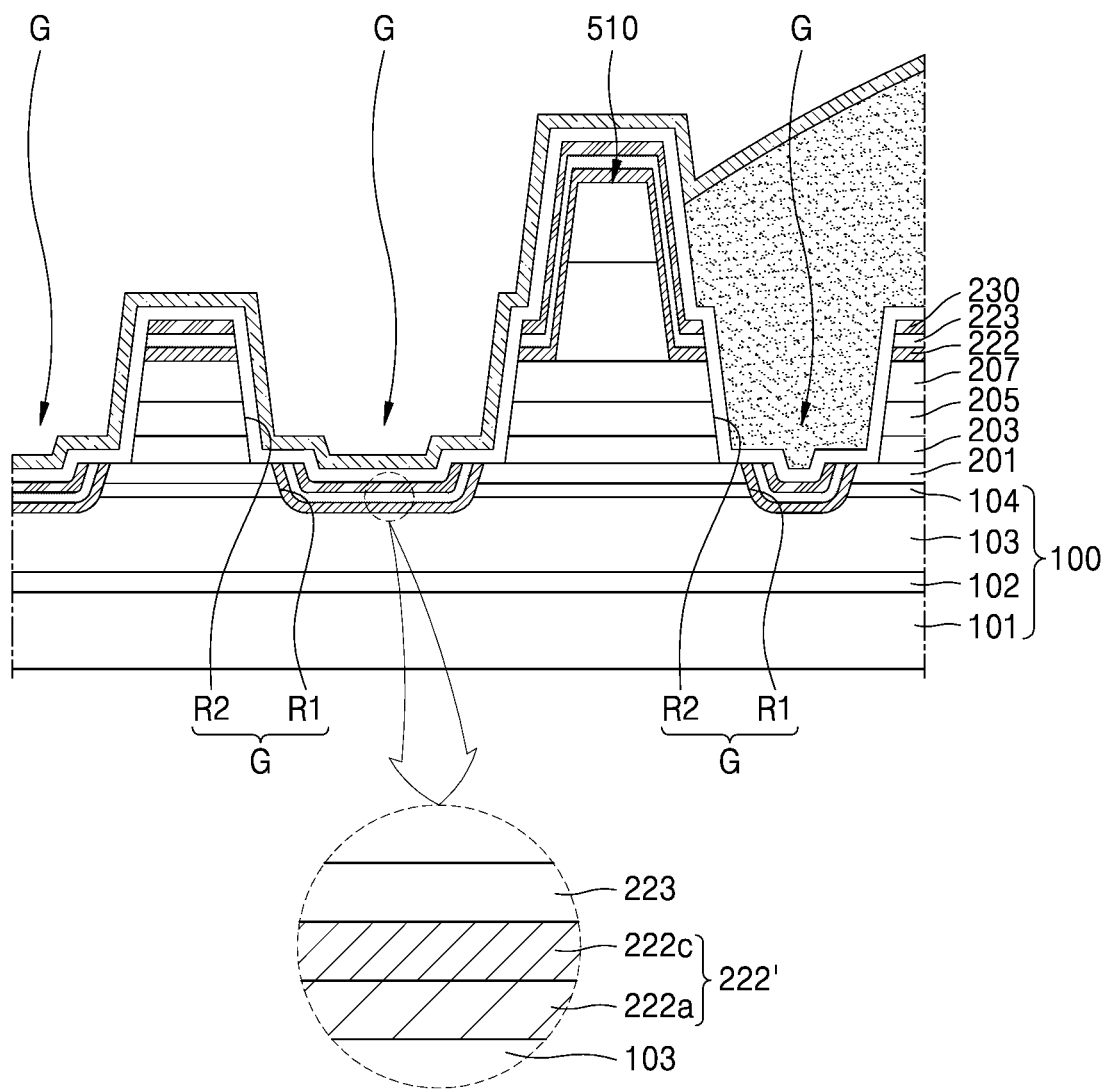
FIG. 16 is an enlarged cross-sectional view of a region of FIG. 15.

FIG. 15 is a cross-sectional view of a display panel according to an embodiment; and FIG. 16 is an enlarged cross-sectional view of a groove of the display panel according to an embodiment. FIG. 15 may correspond to a cross-section taken along the line IX-IX' in FIG. 6, and FIG. 16 may correspond to a cross-sectional view enlarged and showing the groove in FIG. 15.

Referring to FIG. 15, the display panel 10 includes the opening area OA, the display area DA, and the first non-display area NDA1 therebetween. The display panel 10 may include a first opening 10H corresponding to the opening area OA.

In FIG. 15, the display panel 10 is shown having the groove G illustrated in FIG. 8. However, the present disclosure is not limited thereto. For example, the display panel 10 may have the groove G illustrated in any of FIGS. 10 to 13.

Referring to the display area DA in FIG. 15, the thin-film transistor TFT and the storage capacitor Cst on the substrate 100 are arranged in the display area DA.

In an embodiment, the substrate 100 may include multiple layers. For example, the substrate 100 may include a first base layer 101, a first barrier layer 102, a second base layer 103, and a second barrier layer 104, which are sequentially stacked.

In an embodiment, each of the first and second base layers 101 and 103 may include a polymer resin. For example, the substrate 100 may include a polymer resin such as PES, PAR, PEI, PEN, PET, PPS, PI, PC, TAC, CAP, and the like. The above-described polymer resin may be transparent.

Each of the first and second barrier layers 102 and 104 is a barrier layer for preventing or substantially preventing penetration of external foreign matter and may include a single layer or multiple layers including an inorganic material, such as silicon nitride (SiNx) and/or silicon oxide (SiOx).

The insulating layers 201, 203, 205, 207, and 209 may be interposed between a semiconductor layer and electrodes of the thin-film transistor TFT and between electrodes of the storage capacitor Cst. The pixel electrode 221, the intermediate layer 222, the opposite electrode 223, and the capping layer 230 electrically connected to the thin-film transistor TFT may be in the display area DA, and the structures described above may be as described above with reference to FIG. 7.

A display element including the pixel electrode 221, the intermediate layer 222, and the opposite electrode 223 is covered with a thin-film encapsulation layer 300. In an embodiment, the thin-film encapsulation layer 300 may include at least one organic encapsulation layer and at least one inorganic encapsulation layer. In an embodiment, as shown in FIG. 15, the thin-film encapsulation layer 300 includes first and second inorganic encapsulation layers 310 and 330 and an organic encapsulation layer 320 therebetween. In another embodiment, the number of organic encapsulation layers, the number of inorganic encapsulation layers, and a stacking order thereof may be varied.

The first inorganic encapsulation layer 310 may include one or more inorganic insulating materials, such as aluminum oxide, titanium oxide, tantalum oxide, hafnium oxide, zinc oxide, silicon oxide, silicon nitride, or silicon oxynitride, and may be formed using a CVD method or the like. The organic encapsulation layer 320 may include a polymer-based material. Examples of the polymer-based material may include an acrylic resin, an epoxy resin, polyimide, and polyethylene.

Referring to the first non-display area NDA1 of FIG. 15, the first non-display area NDA1 may include a first sub-non-display area SNDA1 relatively adjacent to the display area DA and a second sub-non-display area SNDA2 relatively adjacent to the opening area OA or the first opening 10H.

The first sub-non-display area SNDA1 may be an area through which signal lines, for example, the data lines DL described with reference to FIG. 5, pass. The data lines DL shown in FIG. 15 may correspond to data lines that bypass the opening area OA. The first sub-non-display area SNDA1 may be a wiring area or a bypass area through which the data lines DL pass.

In an embodiment, the data lines DL may be alternately arranged with an insulating layer therebetween as shown in FIG. 15. In another embodiment, although not shown, the data lines DL may be arranged on a same insulating layer. When the neighboring data lines DL are arranged below and above an insulating layer (e.g., the second interlayer insulating layer 207), respectively, gaps (pitches) between neighboring data lines DL may be reduced and a width of the first non-display area NDA1 may be reduced. Although FIG. 15 shows that the data lines DL are located in the first subnon-display area SNDA1, the scan lines bypassing the opening area OA described above with reference to FIG. 5 may also be located in the first sub-non-display area SNDA1.

The second sub-non-display area SNDA2 is a kind of groove area in which grooves are arranged, and FIG. 15 shows three grooves located in the second sub-non-display area SNDA2. The groove G may be formed in a multilayer film having first and second layers including different materials as described above with reference to FIGS. 8 to 13. In an embodiment, FIG. 15 shows the groove G formed in a sublayer provided on the substrate 100 and the insulating layers 201, 203, 205, and 207 included in a display panel.

Referring to the second sub-non-display area SNDA2 of FIG. 15 and FIG. 16, the groove G may be formed by removing a portion of each of the second interlayer insulating layer 207, the first interlayer insulating layer 205, the gate insulating layer 203, the buffer layer 201, the second barrier layer 104, and the second base layer 103. For example, a hole penetrating the second interlayer insulating layer 207, the first interlayer insulating layer 205, the gate insulating layer 203, the buffer layer 201, and the second barrier layer 104, and a recess provided in the second base layer 103 may be spatially connected to each other to form the groove G. The second base layer 103, the second barrier layer 104, and the buffer layer 201 may correspond to the first layer L1 of the multilayer film ML described above with reference to FIGS. 8 to 13, and the second interlayer insulating layer 207, the first interlayer insulating layer 205, and the gate insulating layer 203 may correspond to the second layer L2 of the multilayer film ML.

In an embodiment, a portion of each of the buffer layer 201, the second barrier layer 104, and the second base layer 103 may be concurrently (e.g., simultaneously) removed to form the first recessed portion R1 of the groove G in the process of forming the groove G. Although the buffer layer 201 and the second barrier layer 104 are described as separate components in this specification, in an embodiment, the buffer layer 201 of the substrate 100 may be a sublayer of the second barrier layer 104 having a multilayer structure.

In the process of forming the second recessed portion R2 of the groove G, holes may be formed in the second interlayer insulating layer 207, the first interlayer insulating layer 205, and the gate insulating layer 203 to form the second recessed portion R2.

The first recessed portion R1 and the second recessed portion R2 have different widths such that steps in the form of stairs may be formed on a side surface of the groove G.

The first and second functional layers 222a and 222c, the opposite electrode 223, and/or the capping layer 230 corresponding to the sublayer 222' of an intermediate layer may be disconnected by the grooves G of the second sub-non-display area SNDA2 as described above.

The first inorganic encapsulation layer 310 of the thin-film encapsulation layer 300 has relatively better step coverage than the sublayer 222' of the intermediate layer, the opposite electrode 223, and/or the capping layer 230. Therefore, in an embodiment, the first inorganic encapsulation layer 310 may be continuously formed without being disconnected around the groove G.

In an embodiment, the first inorganic encapsulation layer 310 may entirely cover the display area DA and the first non-display area NDA1, as shown in FIG. 15. In an embodiment, in the first non-display area NDA1, the first inorganic encapsulation layer 310 may cover the inner surface of the grooves G entirely and continuously. A stack of the first and second functional layers 222a and 222c, the opposite electrode 223, and the capping layer 230, which are disconnected, is on a bottom surface of the groove G. The first inorganic encapsulation layer 310 may be disposed while covering the stack.

The organic encapsulation layer 320 may be formed by applying a monomer and curing the monomer. In an embodiment, the flow of the monomer may be controlled by a dam portion 510. In this regard, FIGS. 15 and 16 show that an end portion of the organic encapsulation layer 320 is located at a side of the dam portion 510. The organic encapsulation layer 320 may fill any one of the grooves G. For example, a space on the first inorganic encapsulation layer 310 of the groove G located between the display area DA and the dam portion 510 may be filled with the organic encapsulation layer 320.

In an embodiment, the second inorganic encapsulation layer 330 may cover the inner surface of the groove G entirely and continuously, like the first inorganic encapsulation layer 310. A portion of the second inorganic encapsulation layer 330 may directly contact the first inorganic encapsulation layer 310 in the second sub-non-display area SNDA2. The second inorganic encapsulation layer 330 may directly contact the first inorganic encapsulation layer 310 on at least one of the plurality of grooves G. The first and second inorganic encapsulation layers 310 and 330 may contact each other even on an upper surface of the dam portion 510.

Figure 17:
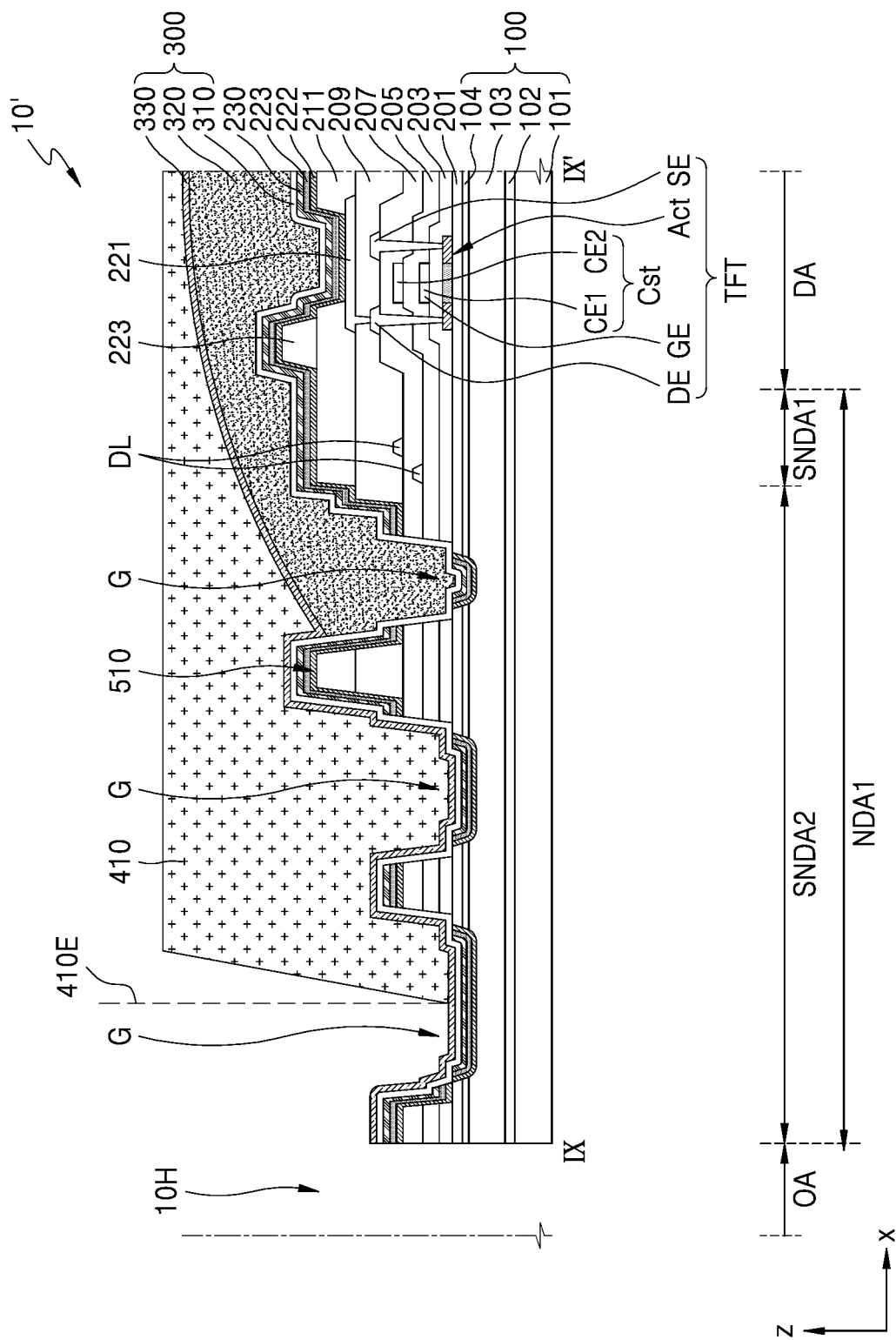
FIG. 17 is a cross-sectional view of a display panel according to another embodiment.

FIG. 17 is a cross-sectional view of a display panel according to another embodiment.

A display panel 10' shown in FIG. 17 further includes a planarization layer 410 unlike the display panel 10 described above with reference to FIG. 15. Herein, the differences will be mainly described for convenience of explanation.

The planarization layer 410 may include an organic insulating material. In an embodiment, the planarization layer 410 may be formed on the thin-film encapsulation layer 300 by applying a photoresist (negative or positive) or a polymer-based organic material thereon and patterning the same. An end 410E of the planarization layer 410 may be placed on a vertical line passing through any one of the grooves G, as shown in FIG. 17. In an embodiment, the end 410E of the planarization layer 410 may be on the same vertical line as an end of the substrate 100.

The planarization layer 410 covers an area where the organic encapsulation layer 320 is not present in the second sub-non-display area SNDA2, thereby improving flatness of the display panel 10. Therefore, it is possible to prevent or substantially prevent an input sensing member, an optical functional member, or the like, which is formed directly on the display panel 10 or is coupled thereto by an adhesive layer, from being detached or separated from the display panel 10.

In a display panel according to embodiments, a groove having a step on a side surface thereof is disposed around an opening such that display elements may be prevented or substantially prevented from being damaged by foreign matter, such as external moisture. However, this is merely an example, and the scope of the present disclosure is not limited thereto.

It is to be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as set forth by the following claims.

The invention claimed is:

1. A display panel comprising:
   a plurality of display elements arranged in a display area around an opening, each of the display elements comprising a pixel electrode, an emission layer above the pixel electrode, and an opposite electrode above the emission layer;
   at least one of a first functional layer between the pixel electrode and the emission layer and a second functional layer between the emission layer and the opposite electrode; and
   a groove between the opening and the display area,
   wherein the groove comprises a first recessed portion having a first width in a first layer, and a second recessed portion in a second layer on the first layer and having a second width greater than the first width so as to expose a portion of an upper surface of the first layer, and a side surface of the groove comprises steps,
   the first functional layer directly contacts an upper surface of the second layer,
   the groove is at least as wide as the second width from the upper surface of the first layer to the upper surface of the second layer, and
   the at least one of the first functional layer and the second functional layer is cut off on the upper surface of the second layer or the portion of the upper surface of the first layer.

2. The display panel of claim 1, wherein the at least one of the first functional layer and the second functional layer and the opposite electrode are each cut off around the second recessed portion and located on a side wall of the first recessed portion.

3. The display panel of claim 2, further comprising a capping layer above the opposite electrode,
   wherein the capping layer is continuously arranged over the first recessed portion and the second recessed portion.

4. The display panel of claim 2, wherein the first layer comprises a first organic material layer and a first inorganic material layer on the first organic material layer, and the first recessed portion spatially connects a hole passing through the first inorganic material layer to a recess defined in a depth direction of the first organic material layer.

5. The display panel of claim 2, wherein the first layer comprises a first organic material layer and a first inorganic material layer on the first organic material layer, and the first recessed portion spatially connects a hole passing through the first inorganic material layer to an upper surface of the first organic material layer.

6. The display panel of claim 1, wherein the at least one of the first functional layer and the second functional layer and the opposite electrode are each cut off around the first recessed portion and located on the portion of the upper surface of the first layer exposed by the second recessed portion.

7. The display panel of claim 1, further comprising a substrate and a pixel circuit arranged on the substrate and comprising a thin-film transistor above the substrate and electrically connected to the pixel electrode.

8. The display panel of claim 7, wherein the substrate comprises a portion of the first layer.

9. The display panel of claim 1, wherein the second layer comprises a multi-layered inorganic layer.

10. The display panel of claim 1,
    wherein the groove comprises a first groove and a second groove around the first groove, and
    the display panel further comprises a dam portion protruding between the first groove and the second groove in a direction of an upper surface of a substrate.

11. The display panel of claim 10, further comprising a thin-film encapsulation layer covering the plurality of display elements and comprising a first inorganic encapsulation layer, an organic encapsulation layer, and a second inorganic encapsulation layer which are sequentially laminated,
    wherein the organic encapsulation layer is above the first groove, and the first inorganic encapsulation layer and the second inorganic encapsulation layer directly contact the second groove.

12. A display panel comprising:
    a plurality of display elements arranged in a display area around an opening, each of the display elements comprising a pixel electrode, an emission layer above the pixel electrode, and an opposite electrode above the emission layer;
    a groove between the opening and the display area;
    a thin-film encapsulation layer covering the plurality of display elements and comprising a first inorganic encapsulation layer, an organic encapsulation layer, and a second inorganic encapsulation layer which are sequentially laminated; and
    a planarization layer above the thin-film encapsulation layer,
    wherein the groove comprises a first recessed portion having a first width in a first layer, and a second recessed portion in a second layer on the first layer and having a second width greater than the first width, and a side surface of the groove comprises steps, and
    wherein an end of the planarization layer is on a vertical line passing through the groove.

13. A display panel comprising:
    a substrate comprising an opening and a display area around the opening;
    a plurality of display elements located in the display area and each comprising a pixel electrode, an intermediate layer, an emission layer, and an opposite electrode; and
    a groove between the opening and the display area,
    wherein the groove comprises a first recessed portion having a first width in a first layer, and a second recessed portion in a second layer on the first layer and having a second width greater than the first width so as to expose a portion of an upper surface of the first layer, and a side surface of the groove comprises steps,
    a functional layer of the intermediate layer directly contacts an upper surface of the second layer,
    the groove is at least as wide as the second width from the upper surface of the first layer to the upper surface of the second layer, and
    the intermediate layer is cut off on the upper surface of the second layer or the portion of the upper surface of the first layer and located on a side wall of the first recessed portion or a side wall of the second recessed portion.

14. The display panel of claim 13, further comprising a capping layer on the opposite electrode,
    wherein the capping layer is continuously arranged over the first recessed portion and the second recessed portion.

15. The display panel of claim 13, wherein the first layer comprises a first organic material layer and a first inorganic material layer on the first organic material layer, and the first recessed portion spatially connects a hole passing through the first inorganic material layer to a recess defined in a depth direction of the first organic material layer.

16. The display panel of claim 13, wherein the first layer comprises a first organic material layer and a first inorganic material layer on the first organic material layer, and the first recessed portion spatially connects a hole passing through the first inorganic material layer to an upper surface of the first organic material layer.

17. The display panel of claim 13, further comprising a pixel circuit comprising a thin-film transistor above the substrate and electrically connected to the pixel electrode.

18. The display panel of claim 13, wherein the substrate comprises a portion of the first layer.

19. The display panel of claim 13,
wherein the groove comprises a first groove and a second groove around the first groove, and
the display panel further comprises a dam portion protruding between the first groove and the second groove in a direction of an upper surface of the substrate.

20. The display panel of claim 13, further comprising:
a thin-film encapsulation layer covering the plurality of display elements and comprising a first inorganic encapsulation layer, an organic encapsulation layer, and a second inorganic encapsulation layer which are sequentially laminated; and
a planarization layer above the thin-film encapsulation layer,
wherein an end of the planarization layer is on a vertical line passing through the groove.

* * * * *